(12) United States Patent
Saraswat et al.

(10) Patent No.: US 8,547,769 B2
(45) Date of Patent: Oct. 1, 2013

(54) ENERGY EFFICIENT POWER DISTRIBUTION FOR 3D INTEGRATED CIRCUIT STACK

(75) Inventors: Ruchir Saraswat, Swindon (GB); Andre Schaefer, Braunschweig (DE); Supriyanto Supriyanto, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 13/077,359

(22) Filed: Mar. 31, 2011

(65) Prior Publication Data

US 2012/0250443 A1    Oct. 4, 2012

(51) Int. Cl.
G11C 5/14    (2006.01)

(52) U.S. Cl.
USPC ........................ 365/226; 365/189.09

(58) Field of Classification Search
USPC .................. 365/226, 189.09, 230.03
See application file for complete search history.

(56) References Cited

U.S. PATENT DOCUMENTS

| | | | |
|---|---|---|---|
| 6,594,169 B2 * | 7/2003 | Sakui | 365/51 |
| 7,906,853 B2 | 3/2011 | Wang | |
| 8,185,690 B2 * | 5/2012 | Miura et al. | 711/115 |
| 2003/0122429 A1 * | 7/2003 | Zhang et al. | 307/43 |
| 2006/0262587 A1 * | 11/2006 | Matsui et al. | 365/63 |
| 2009/0103854 A1 * | 4/2009 | Beausoleil et al. | 385/14 |
| 2009/0103855 A1 | 4/2009 | Binkert et al. | |
| 2010/0290188 A1 | 11/2010 | Brunschwiler et al. | |
| 2010/0332859 A1 * | 12/2010 | Trantham | 713/300 |
| 2011/0050320 A1 | 3/2011 | Gillingham | |

OTHER PUBLICATIONS

International Search Report and Written Opinion mailed Oct. 23, 2012 from International Application No. PCT/US2012/031705.

* cited by examiner

*Primary Examiner* — Vu Le
(74) *Attorney, Agent, or Firm* — Schwabe, Williamson & Wyatt, P.C.

(57) ABSTRACT

Multiple dies can be stacked in what are commonly referred to as three-dimensional modules (or "stacks") with interconnections between the dies, resulting in an IC module with increased circuit component capacity. Such structures can result in lower parasitics for charge transport to different components throughout the various different layers. In some embodiments, the present invention provides efficient power distribution approaches for supplying power to components in the different layers. For example, voltage levels for global supply rails may be increased to reduce required current densities for a given power objective.

13 Claims, 3 Drawing Sheets

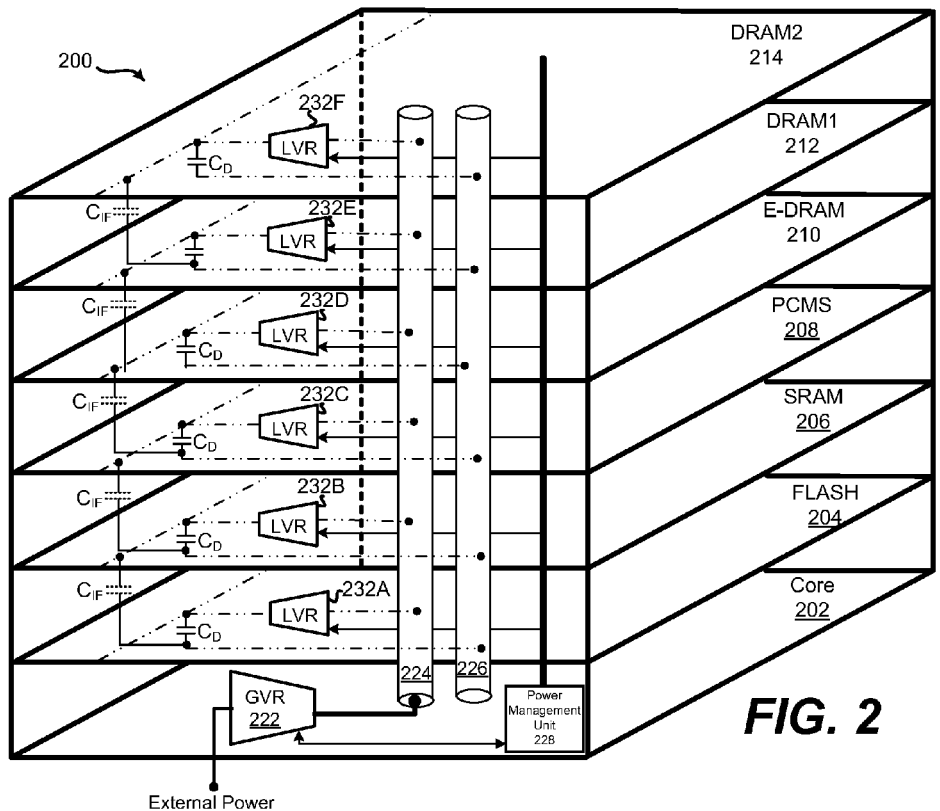
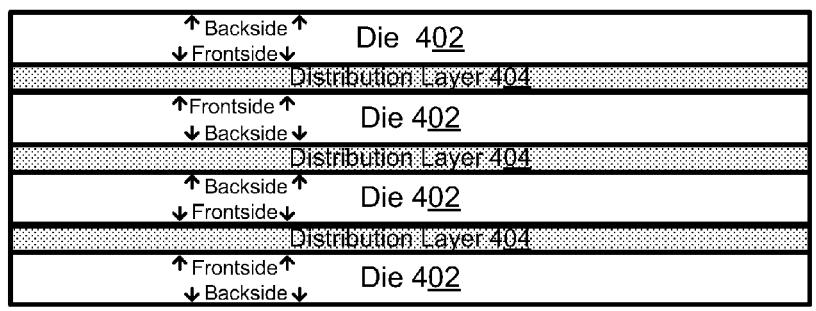

ENERGY EFFICIENT POWER DISTRIBUTION FOR 3D INTEGRATED CIRCUIT STACK

TECHNICAL FIELD

The present invention generally relates to integrated circuits and in particular, to so-called three dimensional integrated circuits.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 2 is a diagram of a 3D IC module with a power distribution topology in accordance with some embodiments.

FIG. 4 shows a side schematic portion of a 3D integrated circuit module in accordance with some embodiments.

DETAILED DESCRIPTION

Multiple dies can be stacked in what are commonly referred to as three-dimensional modules (or "stacks") with interconnections between the dies, resulting in an IC module with increased circuit component capacity. Such structures can result in lower parasitics for charge transport to different components throughout the various different layers.

In some embodiments, the present invention provides efficient power distribution approaches for supplying power to components in the different layers. For example, voltage levels for global supply rails may be increased to reduce required current densities for a given power objective. In some embodiments, a hierarchical design structure, with a high voltage global rail and local down converters, may be employed. Moreover, a mix of die-to-die capacitors (capacitors disposed between adjacent die layers) and on-die capacitors may be used for local power regulation, e.g., to reduce necessary on-die capacitance for a given circuit or to achieve a better yield and/or to provide effective local granular regulation.

In addition, data may be interchanged between non-volatile memory (e.g., PCM and/or flash) and volatile (e-DRAM, DRAM) on the fly, when desired, e.g., to enable shutting down volatile memory blocks. This may lead to increased opportunities for saving power. To exploit such potentially faster memory transfer capabilities, power states, e.g., which may result in more granular control, may be defined in view of particular layers employed in a module. In some embodiments, centralized power state management policies may be used to exploit such states. Finer grain power throttling may be used to, for example, to improve efficiencies through adaptive address re-mapping.

Moreover, the availability of different processes for a single module provides opportunities to locate analog and logic components in a wider variety of complementary destinations. For example, analogue sensitive components can be placed on, for example, PCM/flash process die layers, which may have desirable analog features, e.g., component feature dimensions, supply levels, etc. Similarly, logic transistors can utilize processes better suited for logic circuits (e.g., on the core layer).

Figure 1:
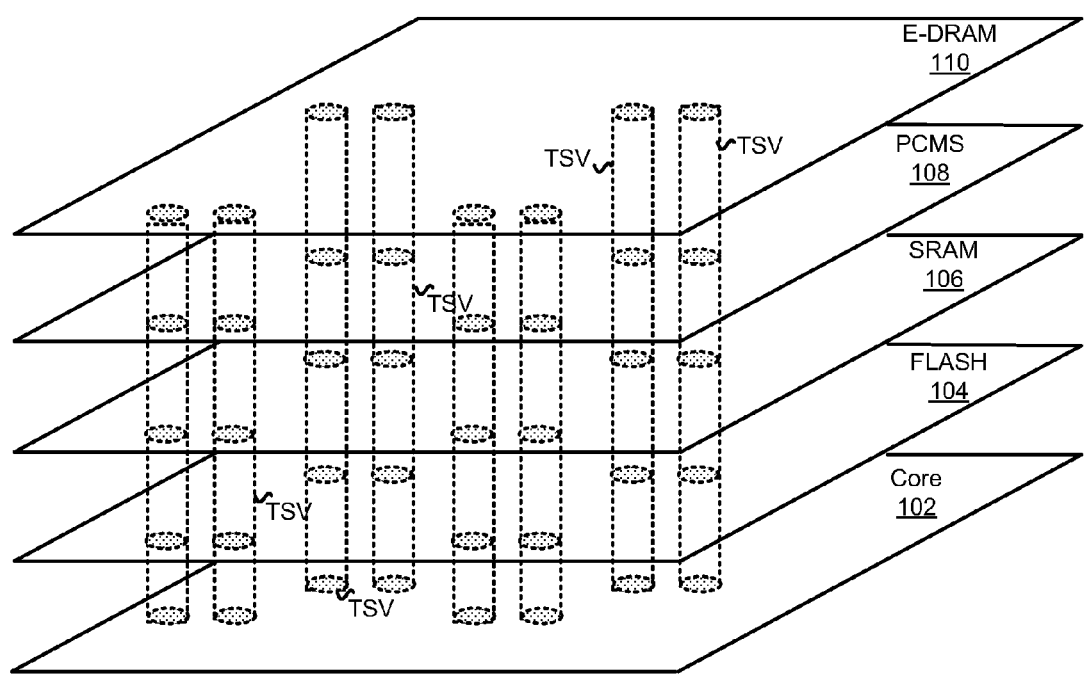
FIG. 1 shows a heterogeneous three-dimensional integrated circuit module.

FIG. 1 is a conceptual view of an exemplary heterogeneous 3D module for a computing device such as a mobile phone, portable personal computer, or a server computer. A heterogeneous module is a module that comprises two or more integrated circuit dies formed from two or more different processes, e.g., available transistor feature dimensions, supply levels, etc. For example, a process for a processor die would typically be different than that for a Flash memory die.

The depicted 3D module has a core layer 102, flash layer 104, SRAM layer 106, PCM (phase change memory) layer 108, and an eDRAM layer 110. It also has numerous through-silicon-vias ("TSV"s) for interconnecting signals and supply references between the different electronic layers. (TSVs may be of different lengths and widths, depending on the functional and loading requirements. There may be other types of interconnect structures, as well, for implementing interconnections between the different layers. Moreover, while TSVs are shown and discussed, other suitable interconnect structures may be used for implementing global supply rails, which are addressed in the following sections.

(Note that eDRAM stands for embedded DRAM, a capacitor-based dynamic random access memory that can be integrated on the same die as an ASIC or processor. It is usually fairly leaky but faster than conventional DRAM. PCM stands for phase-change memory. It is a type of non-volatile computer memory. PCM based memory exploits the unique behavior of chalcogenide glass. PCM cells, for example, may be used to make PCMS, phase change memory & switch, arrays, formed from vertically integrated PCM cells. The 3D modules discussed herein may employ PCM layers and/or PCMS layers, based on particular design considerations.)

FIG. 2 shows a 3D module 200 with a hierarchical power distribution network in accordance with some embodiments. The 3D module 200 generally comprises different die layers (202 to 214), a global voltage regulator (GVR) 222, one or more TSVs used to implement a global high supply rail 224 and a global low supply (e.g., ground or Vss) rail 226, a power management unit (PMU) 228, and local voltage regulators (LVRs) 232, coupled together as shown.

The GVR(s) and LVRs may be implemented with any suitable voltage regulator designs. For example, the GVR 222, which will likely source much more power than the LVRs, may be implemented with switching type DC-DC converters such as a buck, buck-boost or boost-buck converter, synchronous or otherwise, depending on whether the "external voltage" is being down or up converted. Other suitable designs could also be employed. In some embodiments, the GVR and PMU may be disposed in a host controller, which may be part of the core die 202. Alternatively, it could be in a separate die layer. Similarly, the PMU 228 may be implemented with logic in the core layer, as discrete logic or as part of a host or platform controller, or alternatively, it could be implemented with software. It should be appreciated that the GVR and PMU could be located within any part of the module. For example, a flash or memory process may be best suited for the GVR, while the PMU could be disposed with the GVR or on one or more separate layers such as on a memory or CPU layer. An example of a portion of a PMU 228 is discussed below with reference to FIG. 3. In addition, in some embodiments, a GVR may be disposed outside of the module, supplying a global supply to one or more global supply rails from external contacts.

The LVRs, which source less power, may be implemented with switching buck type regulators or with other possibly more suitable designs such as switching capacitor designs. (Switching capacitor designs may be favored since while requiring relatively substantial capacitance, do not require inductors, which exploits the fact that 3D modules may have plenty of available capacitance when taking into account their die-to-die capacitor ($C_{IF}$) capability from the die-to-die interface.) It should be appreciated that as well as being used as down converters, one or more LVRs could also perform step-up conversion, depending on design needs. For example, some memory types may require voltages that are higher than that of a global voltage rail.

The SCVR capacitors may utilize technology specific capacitance, e.g., so-called mim capacitors, trench capacitors, etc. Alternatively, the on-die capacitors may be replaced or augmented by capacitance formed utilizing the redistribution layers (RDL) between the die layers. On the other hand, if VR designs using inductors are employed, inductors could be used. For example, spiral or other inductors (e.g., formed using TSVs in a spiral fashion), could be employed. In some embodiments, VRs employing inductors could, for example, use die-to-die capacitance as blocking capacitors. The RDL (redistribution layer) capacitance could also be used as decoupling caps, for example, an additional decoupling die could be inserted where needed in the stack if desired.

The GVR(s) 222 receive an external supply voltage ("External Power") and convert it to a desired voltage level to be applied to the global high-side rail 224. From here, the power is distributed to multiple layers throughout the module by way of the LVRs 232. While a single LVR is shown for each layer, it should be appreciated that multiple VRs could be used, e.g., for contributing to common supply grids and/or for providing supply levels (different or the same) for one or more different supply domains. In the depicted embodiment, switching capacitor VRs (SCVRs) are used to take advantage of the extra available capacitance opportunities. Each LVR includes on-die capacitors ($C_D$) as well as interface capacitors ($C_{IF}$), which may be formed in distribution layers sandwiched between adjacent die layers.

A possible benefit of such a hierarchal power distribution scheme is that it addresses one of the problems with heterogeneous stacks, the fact that the different requirements for various die layers within the stack would otherwise require numerous different supply rails disposed throughout the stack. Providing separate, dedicated supply rails from outside of the module to each voltage domain within the module could require a large number of TSVs (or other power rail structures), which may not be practical due to the large number of TSVs that already are many times required for other functions in heterogeneous multi-die stacks.

In some embodiments, the high-side rail (224) voltage may be elevated so that adequate power may be provided to the different die layers without violating current density limitations on the TSV(s) used to implement the global high and low reference rails. A problem that can occur with 3D stacks is high current density issues that can be encountered during worst case scenarios, e.g., when all (or even most) of the dies are switching at or near the same time. Typical and/or desired TSV and contact structure parameters may not be able to handle these current levels during these times if the external supply is simply brought into the module and not raised. Accordingly, a global high supply rail may be caused to be at a higher voltage level so as to lower its current density for a given power level.

As the efficiency of the GVRs (or local convertors) and the global high supply rail voltage increase, the current load on the interconnect structures (e.g., TSVs) decrease. (Note that the average current decreases if the average voltage of the GVR rises, regardless of efficiency improvements in a GVR. Efficiency improvements will likely result, e.g., from lower resistive losses in the TSVs due to average current reductions.) The higher voltage can be generated in any suitable manner. For example, it could be generated by a charge pump stage after the GVR, e.g., following a buck converter, or it could be generated simply using a buck/boost topology for the GVR(s) to pump up the voltage at the global high supply rail.

Figure 3:
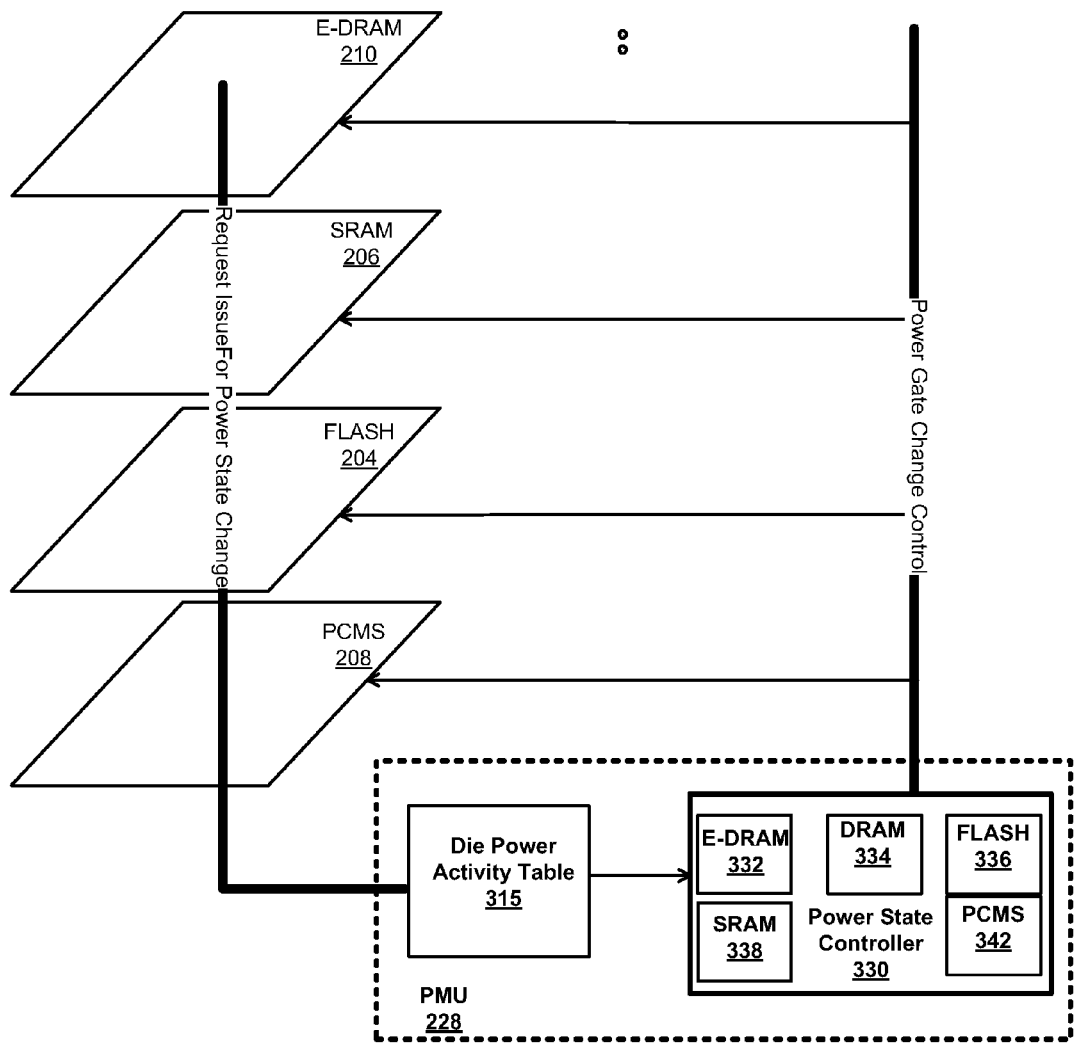
FIG. 3 shows a power state management scheme for a 3D power distribution topology of FIG. 2 in accordance with some embodiments.

FIG. 3 shows the stack of FIG. 2 with an exemplary power management unit 228 for controlling the power states of the different layers. It comprises a power activity table for address mapping and, if desired, for real-time state definitions and tracking It also includes a power state controller 330 to control power gating for domains, blocks and/or whole portions of the different layers in response to presently entered states. Such gating could be implemented through control of one or more LVRs (e.g., if several or many are used per layer) or through gate switches, as is commonly known.

In the depicted embodiment, the layer sections, e.g., memory controller in eDRAM or DRAM (not shown) might request a state change on their own, to then be implemented by the power state controller 330. In other embodiments, the power state controller 330 could initiate state entry, e.g., in response to detecting sufficient inactivity (time-out) or receiving information from a core or processor activity monitor indicating that a layer portion (e.g., DRAM block or section or entire die) may be sufficiently inactive based on task queues or the like.

With a multi-process heterogeneous stack, opportunities may be provided to define new power states for energy efficient operation. Depending on design objectives and current use of the system, which can vary greatly depending on a given application, address mapping could be optimized adaptively during run-time for a current working point. FIG. 3 depicts this with its power activity table 315 and state management data structures for each layer (332 to 342). New power active states can be defined, wherein depending on the tracked activity of layer portions, such as sub-arrays of eDRAM, the portions could be shut down after their data has been transferred into a different memory section, if available, such as into non-volatile memory such as PCMS and vice-versa. This will enable shutting down, for example, "leaky" parts of the module such as DRAM or eDRAM and utilizing, instead, lower power non-volatile memory. This allows for desired trade-offs between performance, power and energy efficiency to be attained.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

As discussed adaptive remapping would enable shutting down parts of unused memory structures for an optimum use of resources available. A power state controller for efficient power management is proposed. The power management unit keeps track of utilization of various dies or dies sections and throttles the power rail of the die or sections of the die in question. FIG. 3 depicts the block diagram for power management unit. It comprises of a Die Power/Activity Table/Controller which monitors the activity changes of power state issued by the core or the memory dies. The power state controller contains the various commands that need to be issued to the various memory dies for change in power state.

FIG. 4 shows a side view of a portion of a 3D stack. It comprises die layers 402, mounted together through distribution layers 404. This figure illustrates that dies may be coupled in desired combinations of front-side to front-side, back-side to back-side, and/or any other suitable combination, depending on particular design concerns. While not depicted, they could also be disposed front-side to back-side, etc. Along these lines, the functional die layers could be in any suitable order, although it may be desirable to dispose layers generating the most heat (e.g., core/processor layer(s)) on the outside, e.g., top or bottom. Likewise, for improved bandwidth, different layers may be made to be closer to certain other layers to achieve faster transfers rates for important channels.

The distribution layers 404 may include multiple conductive layers to facilitate signal interconnection, using vias or other structures, between the different die components. The die-to-die capacitors ($C_{IF}$) may be implemented within the distribution layers. For example, conductive sheets not used for TSV pads, etc., could be used, or additional metal layers could be included.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus, comprising:
   a first die of a first process type coupled to a second die of a second process type coupled to a third die of a third process type, the second die providing a non-volatile memory, and the third die providing a volatile memory;
   a global voltage regulator to provide power to a global high supply rail disposed through the first, second, and third dies to provide a voltage supply to at least one local voltage regulator in each of the first, second, and third dies; and
   a power management unit to control power states wherein for at least one state, data from the third die is transferred to the second die and at least a portion of the third die is powered down.

2. The apparatus of claim 1, in which the second die comprises phase change memory.

3. The apparatus of claim 2, in which the third die comprises eDRAM memory.

4. The apparatus of claim 1, in which the at least one local voltage regulator comprises a switching capacitor voltage regulator.

5. The apparatus of claim 4, in which the global voltage regulator is a DC-to-DC up converter to step up a received external supply voltage.

6. The apparatus of claim 1, in which the first die comprises core logic and facilitates the power management unit.

7. The apparatus of claim 1, in which the power management unit comprises logic to implement adaptive address re-mapping for implementing power state management on the volatile memory.

8. The apparatus of claim 1, further comprising additional dies.

9. The apparatus of claim 1, comprising redistribution layers between the dies, the redistribution layers including die-to-die capacitors coupled to one or more of the local voltage regulators.

10. The apparatus of claim 1, in which the high supply rail is implemented with one or more through-silicon vias.

11. An apparatus, comprising:
    a plurality of heterogeneous dies stacked together to form a 3D integrated circuit stack; and
    one or more global high supply rails within the dies to provide a global high supply to each die, wherein each die has a local voltage regulator to receive as an input the global high supply and to provide a stepped down voltage therefrom, wherein the local voltage regulators are implemented with switching capacitor type regulators including capacitors formed with re-distribution layers between the dies.

12. The apparatus of claim 11, in which the heterogeneous dies comprise a processor die, a non-volatile memory die and a volatile memory die.

13. The apparatus of claim 12, in which the non-volatile memory comprises phase change memory.

* * * * *